(12) United States Patent
Zhang et al.

(10) Patent No.: US 12,068,570 B2
(45) Date of Patent: Aug. 20, 2024

(54) OPTICAL PATH STRUCTURE AND LASER LIGHT PROJECTOR USING OPTICAL PATH STRUCTURE

(71) Applicant: CHANGZHOU HUADA KEJIE OPTO-ELECTRO INSTRUMENT CO., LTD, Jiangsu (CN)

(72) Inventors: Ou Zhang, Jiangsu (CN); Kai Fei, Jiangsu (CN)

(73) Assignee: Changzhou Huada Kejie Opto-Electro Instrument Co., Ltd., Jiangsu (CN)

( * ) Notice: Subject to any disclaimer, the term of this patent is extended or adjusted under 35 U.S.C. 154(b) by 504 days.

(21) Appl. No.: 17/429,622

(22) PCT Filed: Mar. 31, 2020

(86) PCT No.: PCT/CN2020/082376
§ 371 (c)(1),
(2) Date: Aug. 9, 2021

(87) PCT Pub. No.: WO2020/211638
PCT Pub. Date: Oct. 22, 2020

(65) Prior Publication Data
US 2022/0140562 A1    May 5, 2022

(30) Foreign Application Priority Data

Apr. 19, 2019 (CN) .......................... 201910317325.5

(51) Int. Cl.
*G01C 15/00* (2006.01)
*G02B 5/10* (2006.01)
(Continued)

(52) U.S. Cl.
CPC ................ *H01S 3/005* (2013.01); *G02B 5/10* (2013.01); *G02B 27/14* (2013.01); *G02B 27/18* (2013.01); *G01C 15/004* (2013.01)

(58) Field of Classification Search
CPC .......... H01S 3/005; G02B 5/10; G02B 27/14; G02B 27/18; G01C 15/004
(Continued)

(56) References Cited

U.S. PATENT DOCUMENTS 5,216,687 A * 6/1993 Fujino ................. H01S 3/09415
372/71
5,933,393 A * 8/1999 Kitajima .............. G01C 15/004
356/139.1
(Continued)

FOREIGN PATENT DOCUMENTS

CN        203178508 U    9/2013
CN        105005146 A   10/2015
(Continued)

*Primary Examiner* — George B Bennett
(74) *Attorney, Agent, or Firm* — Dentons US LLP

(57) ABSTRACT

A optical path structure and a cross line laser comprising the same are provided. The optical path structure comprises a laser emitter (1) for emitting laser light, and the following devices arranged sequentially along the direction of the optical path of the laser light: an aspherical mirror (2), a first beamsplitter (31) and a second beamsplitter (32), a wedge-shaped mirror (4), and a cylindrical mirror (5). The advantages of the present invention are that: 1) the angle of the incident surface (41) of the wedge-shaped mirror (4) is reasonably set such that the light ray reflected by the incident surface (41) of the wedge-shaped mirror (4) cannot emit onto the beamsplitters (31, 32), or even if it emits onto the beamsplitters (31, 32), there is no interference with the reflected light rays (61, 63) by the beamsplitters (31, 32), avoiding the multiple-point phenomenon; 2) the structure of the wedge-shaped mirror (4) is reasonably set such that the breakpoints in the projected laser light line are eliminated.

7 Claims, 1 Drawing Sheet

(51) Int. Cl.
*G02B 27/14* (2006.01)
*G02B 27/18* (2006.01)
*H01S 3/00* (2006.01)

(58) Field of Classification Search
USPC .......................................... 33/282, 285, 296
See application file for complete search history.

(56) References Cited

U.S. PATENT DOCUMENTS

| | | | | |
|---|---|---|---|---|
| 6,515,783 | B2* | 2/2003 | Perchak | G02B 27/0025 |
| | | | | 359/223.1 |
| 6,707,591 | B2* | 3/2004 | Amm | G02B 27/18 |
| | | | | 348/742 |
| 8,789,956 | B2* | 7/2014 | Dang | G02B 19/0071 |
| | | | | 359/558 |
| 9,816,861 | B2* | 11/2017 | Streeter | H01S 3/0092 |
| 11,217,962 | B2* | 1/2022 | Arakawa | H01S 3/034 |
| 11,681,018 | B2* | 6/2023 | Zhang | G01S 7/4804 |
| | | | | 356/4.01 |
| 11,695,247 | B2* | 7/2023 | Zhou | H01S 3/005 |
| | | | | 359/341.1 |
| 2002/0144415 | A1 | 10/2002 | Dang et al. | |
| 2002/0186448 | A1* | 12/2002 | Amm | G02B 27/18 |
| | | | | 359/290 |
| 2005/0079645 | A1* | 4/2005 | Moriwaka | G02B 27/0994 |
| | | | | 372/29.013 |
| 2010/0142049 | A1* | 6/2010 | Sawabe | G02B 5/3041 |
| | | | | 359/485.01 |
| 2016/0116338 | A1* | 4/2016 | Streeter | G01J 11/00 |
| | | | | 356/300 |
| 2019/0089118 | A1* | 3/2019 | Zhou | H01S 5/4062 |
| 2022/0376456 | A1* | 11/2022 | Zapata-Casares | H01S 3/0612 |
| 2022/0413309 | A1* | 12/2022 | Dang | G02B 27/0927 |
| 2023/0152427 | A1* | 5/2023 | Zhang | G01S 17/08 |
| | | | | 356/4.01 |

FOREIGN PATENT DOCUMENTS

| | | |
|---|---|---|
| CN | 207336959 U | 5/2018 |
| CN | 208621048 U | 3/2019 |
| CN | 109974677 A | 7/2019 |
| CN | 210051332 U | 2/2020 |
| EP | 1067363 A2 | 1/2001 |

* cited by examiner

OPTICAL PATH STRUCTURE AND LASER LIGHT PROJECTOR USING OPTICAL PATH STRUCTURE

CROSS-REFERENCE TO PRIOR APPLICATIONS

This application is a U.S. national stage of PCT/CN2020/082376, filed Mar. 31, 2020, which claims priority to Chinese Patent Application No. 201910317325.5, filed Apr. 19, 2019, each hereby expressly incorporated by reference in its entirety.

TECHNICAL FIELD

The present invention relates to an optical path structure, and a cross line laser comprising the optical path structure.

BACKGROUND

A cross line laser is also referred to as a cross line laser level or a cross line laser marker, which is an instrument adopting laser beam to pass through an optical assembly to form a fan-shaped laser light surface, then project onto a work surface to form a laser light line, and which is usually employed in fields such as engineering construction.

FIG. 1 is a schematic view of a part of an optical path structure constituted by an optical-lens assembly of an existing cross line laser, which structure includes a beamsplitter and a wedge-shaped mirror provided behind the beamsplitter, wherein the surface of the wedge-shaped mirror toward the beamsplitters (the incident surface) is perpendicular to a light ray. However, in practice, it cannot be guaranteed that the light ray is incident perpendicularly on the wedge-shaped mirror, and thus the light ray reflected by the incident surface deviates slightly from the incident light ray. Likewise, the light ray formed by the reflected light ray after being reflected and refracted by the beamsplitters deviates slightly from that formed by the incident light ray after being reflected by the beamsplitters, hence when it is projected onto an object, multiple projection points are formed, resulting in that an operator cannot distinguish, and the accuracy of the projected laser light line is affected.

SUMMARY

In order to overcome the aforementioned problem, the present invention provides an optical path structure comprising a laser emitter for emitting laser light, and the following devices arranged sequentially along the direction of the optical path of the laser light:

an aspherical mirror provided at a light outlet of the laser emitter and employed for focusing laser light emitted by the laser emitter and emitting parallel first light ray with a width of d;

a first beamsplitter and a second beamsplitter, which are both planar lenses, located within the first light ray and at the two sides thereof, not parallel to each other and at a 45-degree to the first light ray respectively; there is a minimum spacing h between the first beamsplitter and the second beamsplitter, which is larger than 0, and less than d; when the first light ray passes through the first beamsplitter and the second beamsplitter, the laser light at the two sides of the first light ray is divided into a first reflected light ray, a first refracted light ray, a second reflected light ray, and a second refracted light ray, wherein both the first reflected light ray and the second reflected light ray are perpendicular to the first light ray, while the first refracted light ray and the second refracted light ray are parallel to the first light ray;

a wedge-shaped mirror comprising an incident surface and an exit surface, both of which are planar; there is a first angle $\alpha$ between the incident surface and the first light ray, and a second angle $\beta$ between the incident surface and the exit surface; the first angle $\alpha$ is larger than 0 degrees and less than 90 degrees; the wedge-shaped mirror is employed for emitting a second light ray after deflecting the first light ray by an angle $\gamma$, and a third refracted light ray and a fourth refracted light ray parallel to the second light ray after deflecting the first refracted light ray and the second refracted light ray by an identical angle $\gamma$; and a cylindrical mirror for scattering the second light ray, the third refracted light ray and the fourth refracted light ray into a laser-light marking line to be projected on a work surface.

Preferably, the aspherical mirror comprises a planar incident surface and an arc exit surface, and has a D-shaped section along the optical path direction.

Preferably, the first angle $\alpha$ is between 65 degrees and 80 degrees, while the angle $\beta$ is between 20 degrees and 50 degrees.

Preferably, the first angle $\alpha$ is between 68 degrees and 78 degrees.

Preferably, the cylindrical mirror is provided with light barriers at the two sides of the direction of the second light ray.

Another aspect of the present invention provides a cross line laser comprising the aforementioned optical path structure.

Preferably, the cross line laser is provided with a light hole respectively along the outgoing direction of the first reflected light ray and the second reflected light ray for the first reflected light ray and the second reflected light ray to exit. (译者 注：原文本段有较长重复词句，建议修改）

Compared with the prior art, the present invention has the following advantages: 1) the angle of the incident surface of the wedge-shaped mirror is reasonably set such that the light ray reflected by the incident surface of the wedge-shaped mirror cannot be incident on the beamsplitters, or even if it is incident on the beamsplitters, there is no interference with the first and second reflected light rays by the beamsplitters, avoiding the multiple-point phenomenon; 2) the structure of the wedge-shaped mirror is reasonably set such that the breakpoints in the projected laser light line are eliminated.

Figure 1:
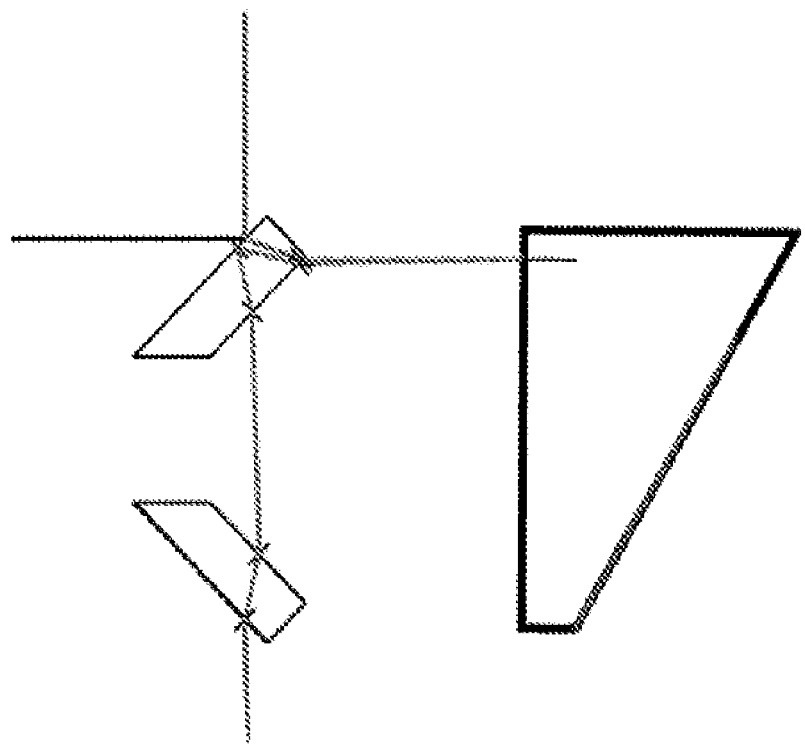
FIG. 1 is a schematic view showing an arrangement of beamsplitters and a wedge-shaped mirror in an optical path structure of a cross line laser in the prior art.

Reference numerals: 1—laser emitter, 2—aspherical mirror, 21—planar incident surface; 22—arc exit surface, 31—first beamsplitter, 32—second beamsplitter, 4—wedged-shaped mirror, 41—incident surface, 42—exit surface, 5—cylindrical mirror, 51—light barrier, 6—first light ray, 61—first reflected light ray, 62—first refracted light ray, 63—second reflected light ray, 64—second refracted light ray, 7—second light ray, 71—third refracted light ray, 72—fourth refracted light ray.

DETAILED DESCRIPTION

Hereinafter the advantage of the present invention will be further set out in conjunction with the accompanying drawings and the detailed embodiments.

FIG. 1 is a schematic view of an arrangement of beamsplitters and a wedge-shaped mirror in an optical path structure of a cross line laser in the prior art, wherein the beamsplitters are used for forming laser-light marking points at both sides of a projected laser light line, so as to achieve an projection effect of "two-point-and-one-line" on a target work surface. In this optical path view, the incident surface of the wedge-shaped mirror is perpendicular to the optical path. At this time, if a light ray could be emitted perpendicularly onto the incident surface as the design intention, the reflected light ray thereof by the incident surface would coincide completely with the incident light ray, and after being refracted by the beamsplitters, would coincide completely with the light ray formed by the original incident light ray after being reflected by the light splitters. In this case, the laser light exit from the optical path would project on the work surface with a "two-point-and-one-line" effect. However, in practice, it cannot be guaranteed that the incident light ray is incident perpendicularly on the wedge-shaped mirror, that is, the incident light ray emitted into the incident surface of the wedge-shaped mirror is always nearly perpendicular to the incident surface. Consequently, the light ray formed by the incident light ray after being reflected by the incident surface of the wedge-shaped mirror would deviate slightly from the incident light ray. The exit direction of the light ray formed by this reflected light ray after being reflected and refracted by the beamsplitters is very close to, but does not coincide with that of the light ray formed by the incident light ray after being reflected by the beamsplitters. Therefore, when the laser light exits from the above-mentioned optical path and projects on the work surface, a projection light line and a plurality of projection points close to each other are formed, such that the projection effect of the cross line laser becomes "multiple-point-and-one-line" instead of the original design of "two-point-and-one-line", resulting in that an operator cannot distinguish, and the operability of the cross line laser is affected.

Figure 2:
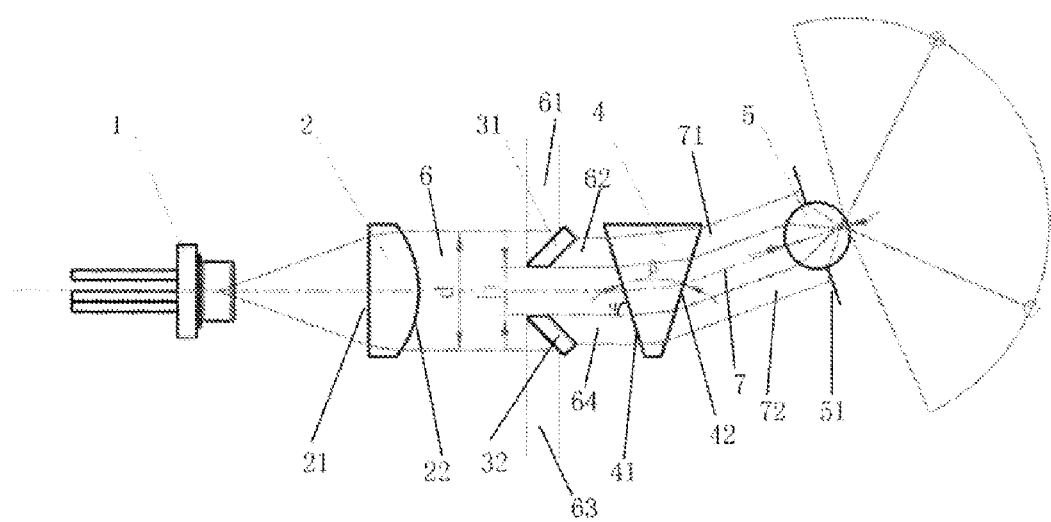
FIG. 2 is a view of an optical path structure of the present invention.

In order to overcome the aforementioned problem, the present invention provides an improved optical path structure, as detailed in FIG. 2. The optical path structure of the present invention comprises a laser emitter 1, which is employed for emitting a divergent laser light along a specific direction. The following devices are arranged sequentially along the direction of the optical path of the laser light:

an aspherical mirror 2 provided at a light outlet of the laser emitter 1 and employed for focusing the divergent laser light emitted by the laser emitter 1 and emitting parallel first light ray 6 with a width of d. Preferably, the aspherical mirror 2 includes a planar incident surface 21 and an arc exit surface 22, and has a D-shaped section along the optical path direction. The aspherical mirror 2 of this shape is not only able to focus the laser light and emit it in a parallel direction, but also of a small volume, thereby saving space.

a first beamsplitter 31 and a second beamsplitter 32, which are both planar lenses, located within the first light ray 6 and at the two sides thereof, not parallel to each other and at a 45-degree angle to the first light ray 6 respectively. There is a minimum spacing h between the first beamsplitter 31 and the second beamsplitter 32, which is larger than 0, and less than d. Thus, the two sides of the first light ray 6 is incident on the first beamsplitter 31 and the second beamsplitter 32 respectively, while the middle part thereof passes through the gap between the first beamsplitter 31 and the second beamsplitter 32. The first beamsplitter 31 and the second beamsplitter 32 is able to not only reflect but also refract the incident light ray; furthermore, due to that the angles between the beamsplitters and the incident light ray are both 45 degrees, the reflected light ray and the incident light ray are perpendicular, and the refracted light ray and the incident light ray are parallel. When the first light ray 6 passes through the first beamsplitter 31 and the second beamsplitter 32, the part of the first light ray 6 incident on the beamsplitters is reflected and refracted at the same time, that is, the laser light at the two sides of the first light ray 6 is split into a first reflected light ray 61, a first refracted light ray 62, a second reflected light ray 63, and a second refracted light ray 64, wherein the first refracted light ray 62 and the second refracted light ray 64 is parallel to the first light ray 6, while both the first reflected light ray 61 and the second reflected light ray 63 exit perpendicularly to the first light ray 6.

a wedge-shaped mirror 4, including an incident surface 41 and an exit surface 42, both of which are planar. There is a first angle α between the incident surface 41 and the first light ray 6, and a second angle β between the incident surface 41 and the exit surface 42. The first angle α is larger than 0 degrees and less than 90 degrees. Preferably, the first angle α is between 65 degrees and 80 degrees, and more preferably, between 68 degrees and 78 degrees. For example, the first angle α could be 70 degrees, 75 degrees, 78 degrees, etc. The wedge-shaped mirror 4 is employed for emitting a second light ray 7 after deflecting the first light ray 6 by an angle γ, and emitting a third refracted light ray 71 and a fourth refracted light ray 72 after deflecting the first refracted light ray 62 and the second refracted light ray 64 by an identical angle γ. On account of being formed by the first light ray 6, the first refracted light ray 62 and the second refracted light ray 64 incident on the incident surface 41 of the wedge-shaped mirror 4 in an identical incident angle and outgoing from the exit surface 42 of the wedge-shaped mirror 4 in an identical outgoing angle, the second light ray 7, the third refracted light ray 71 and the fourth refracted light ray 72 are parallel to each other, too. Preferably, the second angle β is between 20 degrees and 50 degrees, and for instance, it could be 35 degrees. Thus, the laser light line formed by the second light ray 7, the third refracted light ray 71 and the fourth refracted light ray 72 after being scattered and projected onto the work surface, has no breakpoints.

a cylindrical mirror 5 for scattering the second light ray 7, the third refracted light ray 71 and the fourth refracted light ray 72 into a laser-light marking line to be projected on the work surface. Preferably the cylindrical mirror 5 is provided with light barriers 51 at the two sides of the direction of the second light ray 7, so as to prevent the unscattered laser light from projecting on the work surface, thereby making the projected laser light more uniform.

The present invention also provides a cross line laser. In this cross line laser, the aforementioned optical path structure is used as a laser-light emitting device, and there is provided with a light hole respectively along the outgoing direction of the first reflected light ray 61 and the second reflected light ray 63 for them to exit. The diameter of the hole is slightly larger than the width of the first reflected light ray 61 and the second reflected light ray 63, such that only the light ray in the same directions as that of the first reflected light ray 61 and the second reflected light ray 63 can exit from the light hole.

In the optical path structure of the present invention, laser light, after being emitted from a light source and focused by the aspherical mirror 2, is further divided into five light rays by the first beamsplitter 31 and the second beamsplitter 32, wherein the first light ray 6, the first refracted light ray 62, and the second refracted light ray 64, parallel to each other, are incident on the incident surface 41 of the wedge-shaped mirror 4. Due to the incident surface 41 of the wedge-shaped mirror 4 is not perpendicular to the direction of the light ray 6, when the aforementioned light rays are incident on the incident surface 41, the reflected light rays thereof have directions deviating significantly from that of the incident light rays, and thus, are unlikely to emit into the beamsplitters; or even if the reflected light rays are emitted into the beamsplitters, the light rays formed by them after being reflected and refracted by the beamsplitters have directions deviating largely from that of the first reflected light ray 61 and the second reflected light ray 63, thereby unable to form a laser-light projection point on the work surface under the limitation of the light hole. That is, the laser light rays outgoing from the optical path and projected onto the work surface are able to form a "two-point-and-one-line" pattern, avoiding the multiple-point phenomenon.

The cross line laser with the aforementioned optical path structure can project laser light of a "two-point-and-one-line" pattern onto a work surface without the multiple-point phenomenon, and the projected laser light line has no apparent breakpoints, thereby improving the quality of the projected line and the operability for an operator.

It should be noted that the embodiments of the present invention are of good operability, but not for constituting any limitation to the present invention. Any person skilled in the art can make alterations or modifications to the embodiments by the aforementioned technical contents, to form an equivalent and effective embodiment. Any amendments, equivalent changes and modifications to the above-mentioned embodiments based on the technical essence of the present invention, as long as they do not depart from the contents of the technical solutions of the present invention, shall belong to the scope defined by the technical solutions of the present invention.

What is claimed is:

1. An optical path structure comprising a laser emitter for emitting laser light, and the following devices arranged sequentially along the direction of the optical path of the laser light:
    an aspherical mirror provided at a light outlet of the laser emitter and employed for focusing the laser light emitted by the laser emitter and emitting parallel first light ray with a width of d;
    a first beamsplitter and a second beamsplitter, which are both planar lenses, located within the first light ray and at the two sides thereof, not parallel to each other and at a 45-degree angle to the first light ray respectively; there is a minimum spacing h between the first beamsplitter and the second beamsplitter, which is larger than 0, and less than d; when the first light ray passes through the first beamsplitter and the second beamsplitter, the laser light at the two sides of the first light ray is divided into a first reflected light ray, a first refracted light ray, a second reflected light ray, and a second refracted light ray, wherein both the first reflected light ray and the second reflected light ray are perpendicular to the first light ray, while the first refracted light ray and the second refracted light ray are parallel to the first light ray;
    a wedge-shaped mirror comprising an incident surface and an exit surface, both of which are planar; there is a first angle α between the incident surface and the first light ray, and a second angle β between the incident surface and the exit surface; the first angle α is larger than 0 degrees and less than 90 degrees; the wedge-shaped mirror is employed for emitting a second light ray after deflecting the first light ray by an angle γ, and a third refracted light ray and a fourth refracted light ray parallel to the second light ray after deflecting the first refracted light ray and the second refracted light ray by an identical angle γ; and
    a cylindrical mirror for scattering the second light ray, the third refracted light ray and the fourth refracted light ray into a laser-light marking line to be projected on a work surface.

2. The optical path structure according to claim 1, wherein the aspherical mirror comprises a planar incident surface and an arc exit surface, and has a D-shaped section along the optical path direction.

3. The optical path structure according to claim 1, wherein the first angle α is between 65 degrees and 80 degrees, while the angle β is between 20 degrees and 50 degrees.

4. The optical path structure according to claim 3, wherein the first angle α is between 68 degrees and 78 degrees.

5. The optical path structure according to claim 1, wherein the cylindrical mirror is provided with light barriers at the two sides of the direction of the second light ray.

6. A cross line laser comprising the optical path structure according to claim 1.

7. A cross line laser according to claim 6, wherein the cross line laser is provided with a light hole respectively along the outgoing direction of the first reflected light ray and the second reflected light ray for the first reflected light ray and the second reflected light ray to exit.

* * * * *